United States Patent [19]

Takahashi et al.

[11] Patent Number: 5,140,501

[45] Date of Patent: Aug. 18, 1992

[54] MECHANISM FOR INSERTING AND WITHDRAWING PRINTED BOARD UNIT OF ELECTRONICS CIRCUIT DEVICE

[75] Inventors: Tsutomu Takahashi, Yokohama; Hideki Zenitani, Akishima; Itsuo Okamoto, Kawasaki, all of Japan

[73] Assignee: Fujitsu Limited, Kawasaki, Japan

[21] Appl. No.: 455,335

[22] PCT Filed: Apr. 17, 1989

[86] PCT No.: PCT/JP89/00408
§ 371 Date: Dec. 27, 1989
§ 102(e) Date: Dec. 27, 1989

[87] PCT Pub. No.: WO89/10681
PCT Pub. Date: Nov. 2, 1989

[30] Foreign Application Priority Data

Apr. 30, 1988 [JP] Japan .................. 63-105430
Nov. 9, 1988 [JP] Japan .................. 63-281390

[51] Int. Cl.$^5$ ............................................. H05K 7/14
[52] U.S. Cl. ................................. 361/415; 361/395; 361/399; 439/157; 211/41
[58] Field of Search ............... 361/391, 395, 399, 412, 361/413, 415, 417; 439/152, 153, 157, 159; 403/16, 321, 322; 211/41; 360/99.02, 99.06

[56] References Cited

U.S. PATENT DOCUMENTS

| | | | |
|---|---|---|---|
| 4,157,583 | 6/1979 | Basmajian et al. | 361/415 X |
| 4,313,150 | 1/1982 | Chu | 361/415 X |
| 4,580,192 | 4/1986 | Beun | 361/415 X |
| 5,010,444 | 4/1991 | Storrow et al. | 361/415 X |

FOREIGN PATENT DOCUMENTS 3636088 11/1987 Fed. Rep. of Germany ...... 361/415

*Primary Examiner*—Gerald P. Tolin
*Assistant Examiner*—Paramita Ghosh
*Attorney, Agent, or Firm*—Staas & Halsey

[57] ABSTRACT

A mechanism for insertion and withdrawal of a printed board unit (20) to and from a shelf (10), by which the printed board is inserted in the shelf with less force and locked therein after the completion of the operation, an the complete insertion can be confirmed by a click noise and a mark. The mechanism includes a lock arm (26), which is fixed to the printed board unit (20) at the base portion thereof and has a flexible tip, a lever (25) pivoted to the printed board unit (20) and provided with a cam surface (30) for driving the lock arm (26) for insertion and withdrawal of the printed board unit (20), and an aperture (17) formed on the shelf (10) and engageable with the lock arm (26) when the same is in a fixed position. The lever (25) occupies predetermined angular positions, both when the printed board unit (20) is completely engaged to a connector and when the printed board unit is withdrawn therefrom.

8 Claims, 19 Drawing Sheets

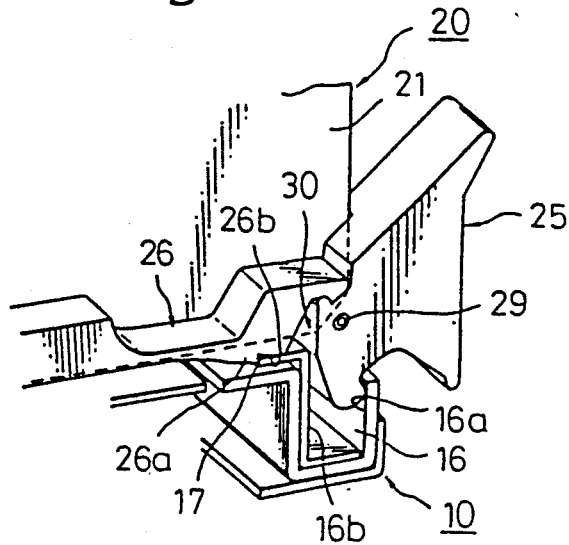
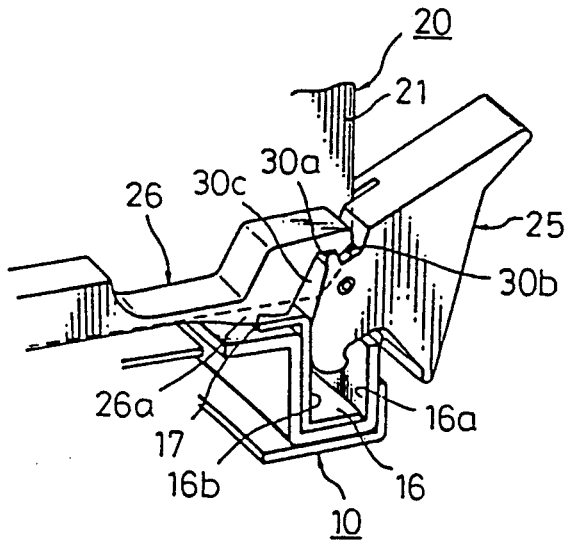
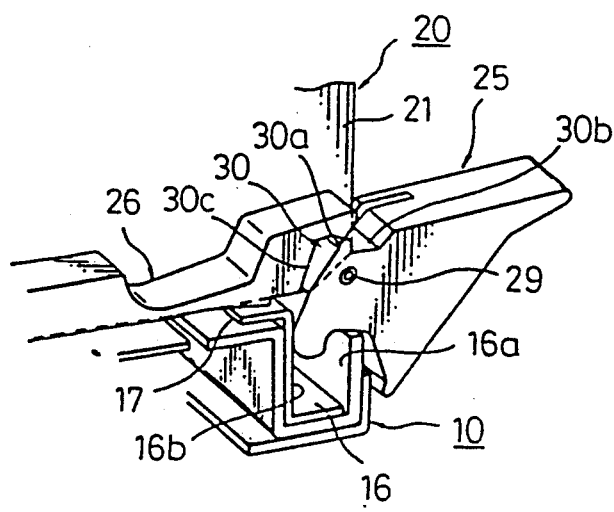

MECHANISM FOR INSERTING AND WITHDRAWING PRINTED BOARD UNIT OF ELECTRONICS CIRCUIT DEVICE

BACKGROUND OF THE INVENTION

1. Field of the Invention

The present invention relates to a mechanism for inserting and withdrawing a printed board unit to and from a shelf of an electronics circuit device.

2. Description of the Related Arts

In an electronics circuit device such as a communication device or an information device, a box-like shelf for accommodating a plurality of printed board units has an open-front for inserting or withdrawing the respective printed board units. A back board is fixed in the interior of the shelf and carries a plurality of female-type connectors mounted thereon. The printed board unit is inserted into the shelf along a guide rail provided on the shelf, and has at the end thereof a male-type connector insertably engageable with the female-type connector. Accordingly, the printed board unit is securely held within the shelf by the frictional force between the connectors and is electrically connected to the back board.

Recently, the mounting density of electronics parts on the printed board has been greatly increased, and thus the number of pins of a male-type connector for electric connection with the back board is correspondingly increased. This necessitates a considerable force for inserting and withdrawing the printed board unit to and from the shelf; so facilitate this operation, it was proposed in for Japanese Unexamined Patent Publication No. 62-119999, to provide a lever mechanism on the printed board.

Due to the provision of the lever mechanism, the insertion and withdrawal of the printed board unit can be easily carried out with less force, but in this mechanism, an arm of a holder member for pivotably supporting a lever is resiliently deformed; thus the pivoting position of the lever is shifted during the insertion or withdrawal of the printed board unit to and from the shelf. Therefore, the force applied on the printed board unit when connecting or disconnecting the connectors becomes unstable, and the arm of the holder member is often damaged by the repeated deformation thereof. Further, since the lever can freely rotate around the pivot when the printed board unit is not in the shelf, the lever is naturally pulled down at one end by its own weight, and thus a complicated operation such as manually holding the lever in a horizontal position when the printed board unit is fully inserted into the shelf becomes necessary. Furthermore, if the force necessary for engaging the connectors increased, it is difficult for an operator to correctly judge whether the male-type connector is completely inserted into the female-type connector, and thus the possibility of an imperfect engagement of the connectors and a resulting mis-connection is increased.

Also, because the printed board is formed by a lamination of thin plastic plates having a circuit pattern of an electro-conductive material printed therebetween, the printed board is able to bend due to the difference of heat expansion of the plastic sheets and the printed circuit during the soldering treatment. To solve this problem, a reinforcement member is fixed to the printed board, along four edges of a rectangular shape thereof, by riveting or the like, but this increases the amount of labor required, resulting in a higher manufacturing cost.

SUMMARY OF THE INVENTION

Accordingly, an object of the present invention is to provide a lever mechanism for inserting and withdrawing a printed board unit to and from a shelf, by which a secure engagement therebetween is obtained and it is easily confirmed whether the mating operation has been precisely carried out.

Another object of the present invention is to provide the above type lever mechanism as an integral part of a reinforcement member of a printed board to improve the efficiency of the assembly process.

According to one aspect of the present invention, in an electronics circuit device in which a plurality of printed board units are accommodated in parallel to each other within a box-like shelf, each printed board unit mounting various electronics circuit elements and being provided with a connector at a trailing edge thereof, said printed board connector being insertably connectable with a corresponding mounted on a back board within the shelf, there is provided a mechanism for inserting and withdrawing the printed board unit to and from the shelf. The mechanism comprises a lever means pivotably secured on the printed board at each of upper and lower corners of a leading edge thereof and acting on the printed board unit to displace the board relative to the shelf along at least a distance necessary for engaging or disengaging the printed board connector to and from the back board connector. The mechanism further includes a lock arm secured on the printed board and resiliently deformable and engageable with a stop means formed on the shelf for preventing a loosening of the printed board unit in the shelf after the printed board unit has been completely inserted into the shelf until connectors of the printed board are engaged with connectors of the back board. The lever means has a cam surface in a region confronting the lock arm for converting a rotational motion of the lever means to an engagement/disengagement motion of the lock arm relative to the stop means on the shelf.

According to the above-mentioned lever means of the printed board unit, the lock arm is resiliently deformed while the printed board unit is being pushed into the shelf and an elastic energy stored in the lock arm due to that deformation is immediately released when the printed board unit has been sufficiently inserted so that the connectors of the printed board are fully engaged with the connectors of the shelf and the lock arm is aligned with the stop means formed on a shelf wall, whereby the lock arm enters the stop means and is fitted therein. At this stage the operator can confirm that a secure engagement has been made by a clicking noise heard when the lock arm enters the stop means.

In one embodiment, a projection is provided at a free end of the lock arm, and is aligned with a window formed in a front plate fixed to a leading edge of the printed board. The projection can be observed from outside when the above engagement between the lock arm and the stop means is completed, whereby the operator can visually confirm that a secure engagement has been made, in addition to the above described clicking noise.

According to another aspect of the present invention, the lock arm is made of a resin material and is integrally formed with a reinforcement member which is secured horizontallt onto an upper or lower edge of the printed board. The reinforcement member is provided with a vertical through-hole allowing the passage of an air stream. The through-hole extends substantially the entire length of the reinforcement member. Therefore, the labor and cost of assembling the printed board unit can be greatly reduced, and further, an air stream caused by heat generated due to the action of the printed board unit can smoothly pass through a space between the adjacent printed board units and be exhausted outside via the through-hole.

Preferably, the reinforcement member to be secured on the printed board along an upper or lower edge thereof is provided with a groove for a press-fit engagement with the opposite ends of a vertical reinforcement member, whereby the upper and lower horizontal reinforcement members are fixedly connected to each other. Accordingly, a pair of horizontal reinforcement members and the vertical reinforcement member can be rigidly assembled as one body by fitting the free ends of the latter into the engagement grooves of the former, whereby the printed board is strengthened and will not bend backward.

BRIEF DESCRIPTION OF THE DRAWINGS

The present invention will be described in more detail with reference to the preferred embodiments illustrated in the following attached drawings, wherein;

FIG. 2 is an enlarged front perspective view of the printed board unit shown in FIG. 1 on;

FIGS. 10(a) through (e) are, respectively, perspective views, illustrating a sequential motion of a lever and a lock arm during the withdrawal of the board unit;

DESCRIPTION OF THE PREFERRED EMBODIMENTS

Figure 1:
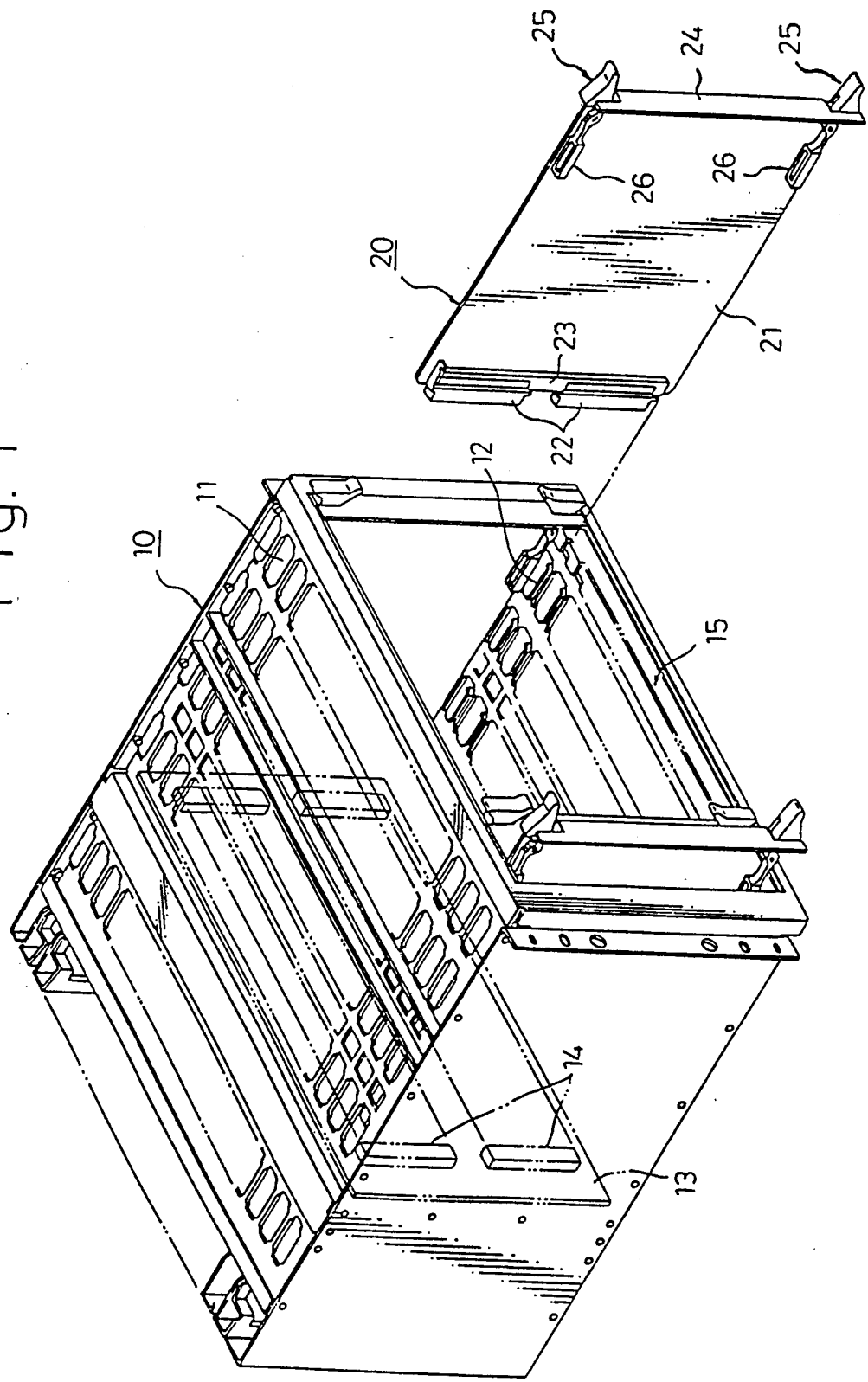
FIG. 1 is a perspective view of a printed board unit and a shelf according to a first embodiment of the present invention.
Figure 2:
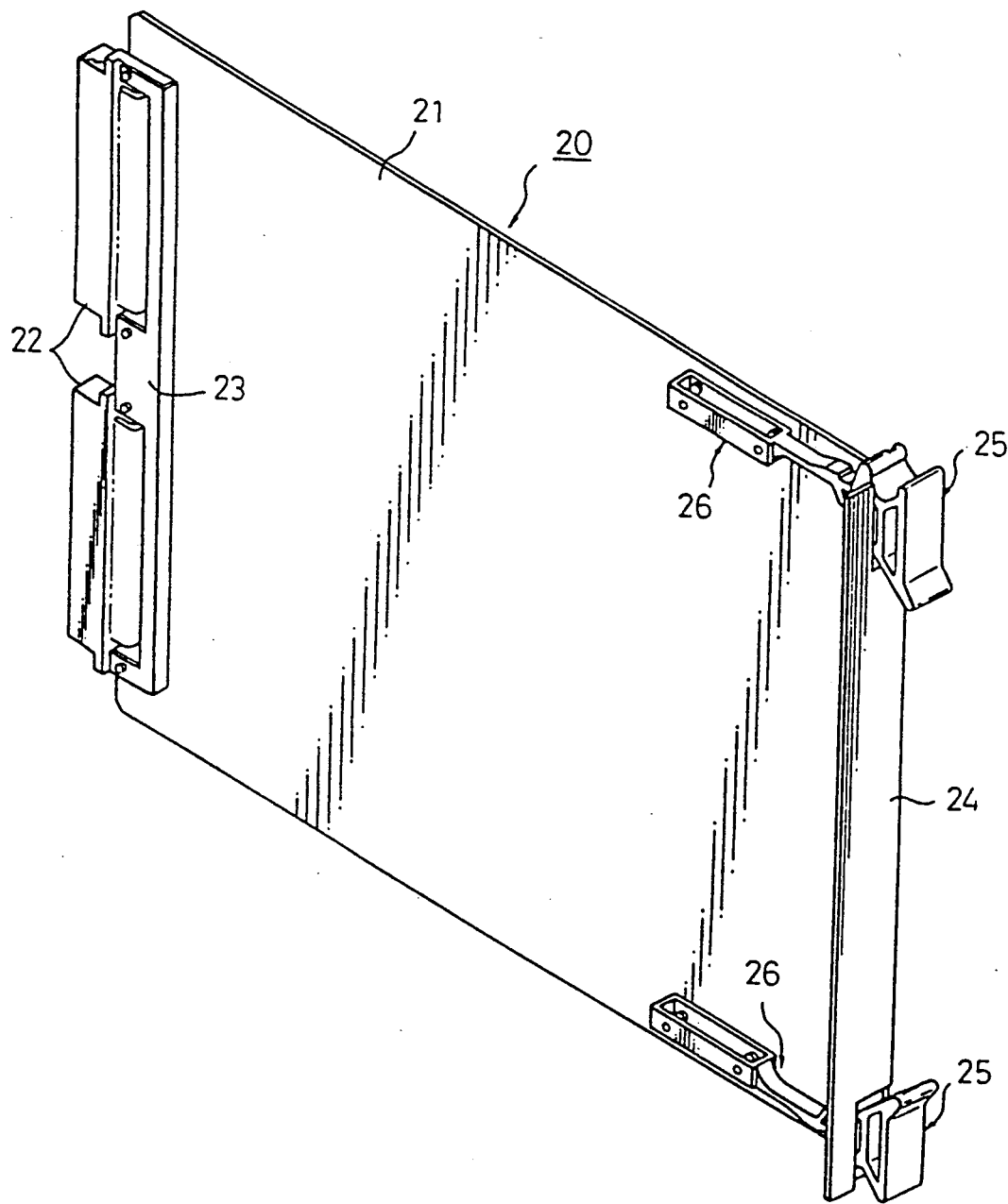
Figure 3:
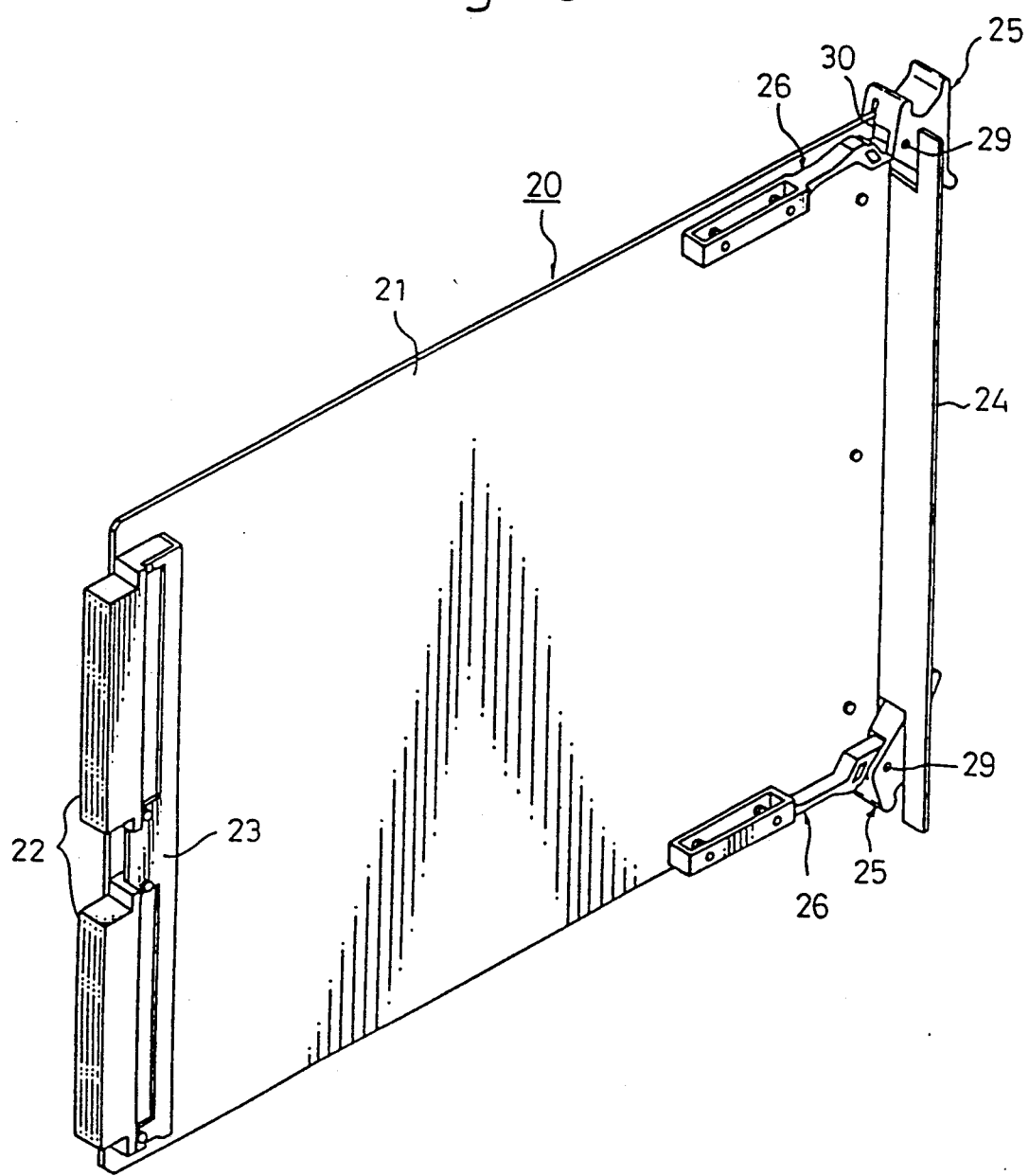
FIG. 3 is a rear perspective view of the printed board unit of FIG. 1.
Figure 4:
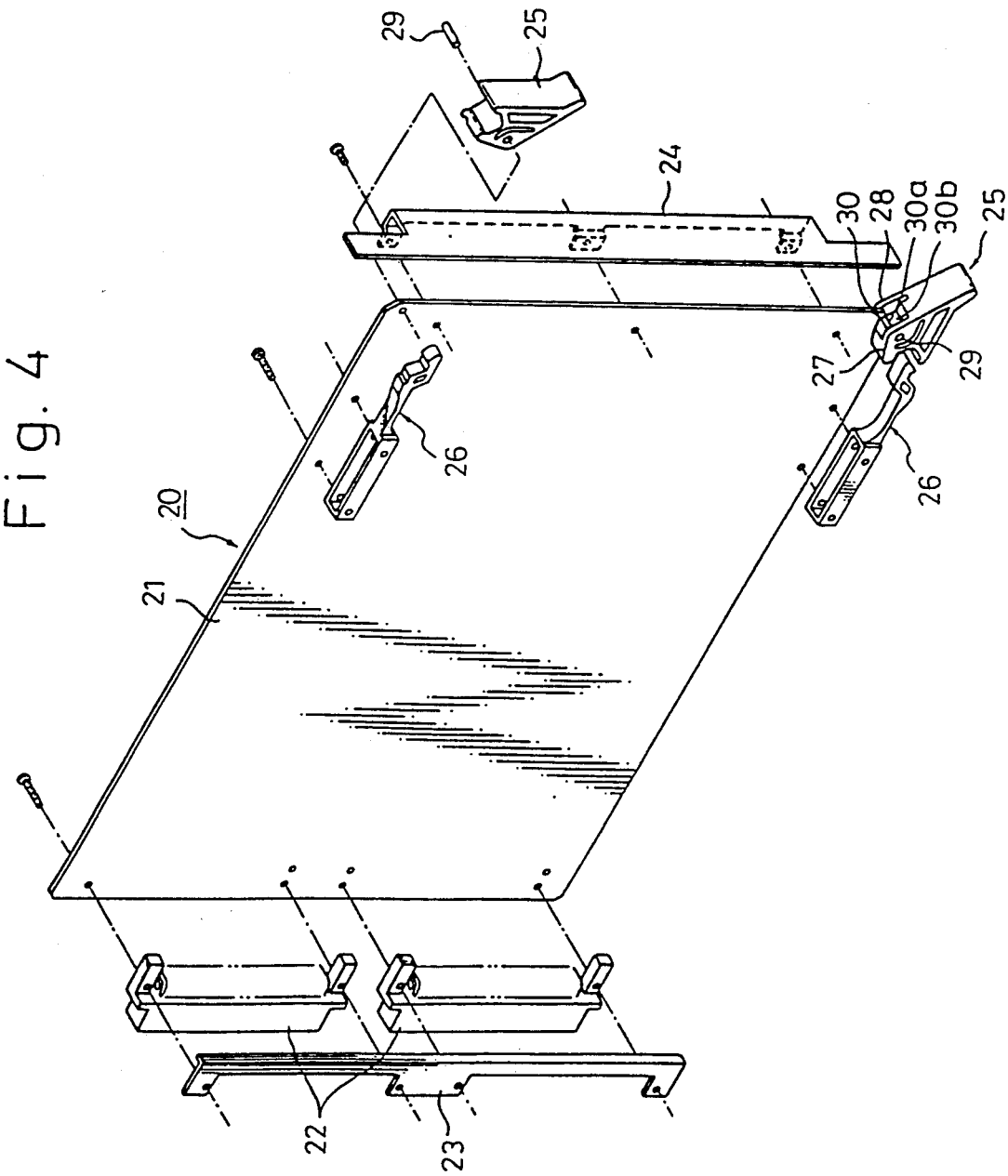
FIG. 4 is an exploded perspective view of the printed board unit according to the first embodiment of the present invention.

FIG. 1 illustrates a printed board unit provided with an insertion and withdrawal mechanism according to a first embodiment of the present invention, and a shelf carrying the printed board units. FIGS. 2 through 4 illustrate in detail the entire structure of the printed board unit shown in FIG. 1. FIGS. 5 through 11 illustrate, respectively, the detailed structure and steps of the operation of the main parts of the insertion and withdrawal mechanism shown in FIG. 1.

First, referring to FIGS. 1 through 4, a box-like shelf 10 with an open front is provided with a plurality of pairs of upper and lower guide rails 11 and 12 on top and bottom walls thereof, respectively, for guiding a printed board unit 20 during the insertion and withdrawal thereof, whereby the printed board units 20 are vertically mounted within the shelf unit 10 in parallel to each other. A back board 13 having plurality of female-type connectors 14 mounted on the front surface thereof is fitted inside the shelf 10.

The printed board unit 20 comprises a printed board 21 to be inserted into the shelf 10 along the guide rails 11 and 12. Note, a plurality of electronics circuit elements are arranged on the mounting surface of the printed board 21 but these elements are not illustrated in the drawings as they are not directly relevant to the present invention.

A trailing edge of the printed board 21 confronts the back board 13 when the printed board 21 is accommodated in the shelf 10, and in the vicinity of the trailing edge, a male-type connector 22 is fixedly secured on the mounting surface of the printed board 21. The male-type connector 22 is provided with a plurality of pins, each insertably engageable with a corresponding female-type connector 14 mounted on the back board 13. Accordingly, the printed board unit 20 is electrically connected to the back board 13 and firmly held within the shelf 10 when a frictional engagement between the connectors 14 and 22 is made.

In this embodiment, a vertical reinforcement member 23 is fixedly mounted on the printed board 21 together with the male-type connector 22, to prevent bending of the printed board 21.

A front plate 24 having an L-shaped cross section is fixedly secured by screws to the leading edge of the printed board 21, and small parts such as a switch, signal connector or a label are mounted thereon as required.

A lock arm 26 having a rectangular shape is fixed along each upper and lower horizontal edge of the printed board 21 at the front of the printed board 21, for locking the printed board unit 20 in the shelf 10. The lock arm 26 is made of a plastic, such as polyphenylenesulfide, having an elasticity and is mounted in a cantilever manner so that the front half thereof can be resiliently bent in the up-down direction when a force is applied thereto. A lever 25 is provided in front of the lock arm 26, for moving the lock arm 26 when inserting and withdrawing the printed board unit 20 to and from the shelf unit 10. As the structure and function of the upper and lower pairs of these elements 25 and 26 is identical in principle, the following explanation will relate only to the lower pair of elements 25 and 26.

Figure 5:
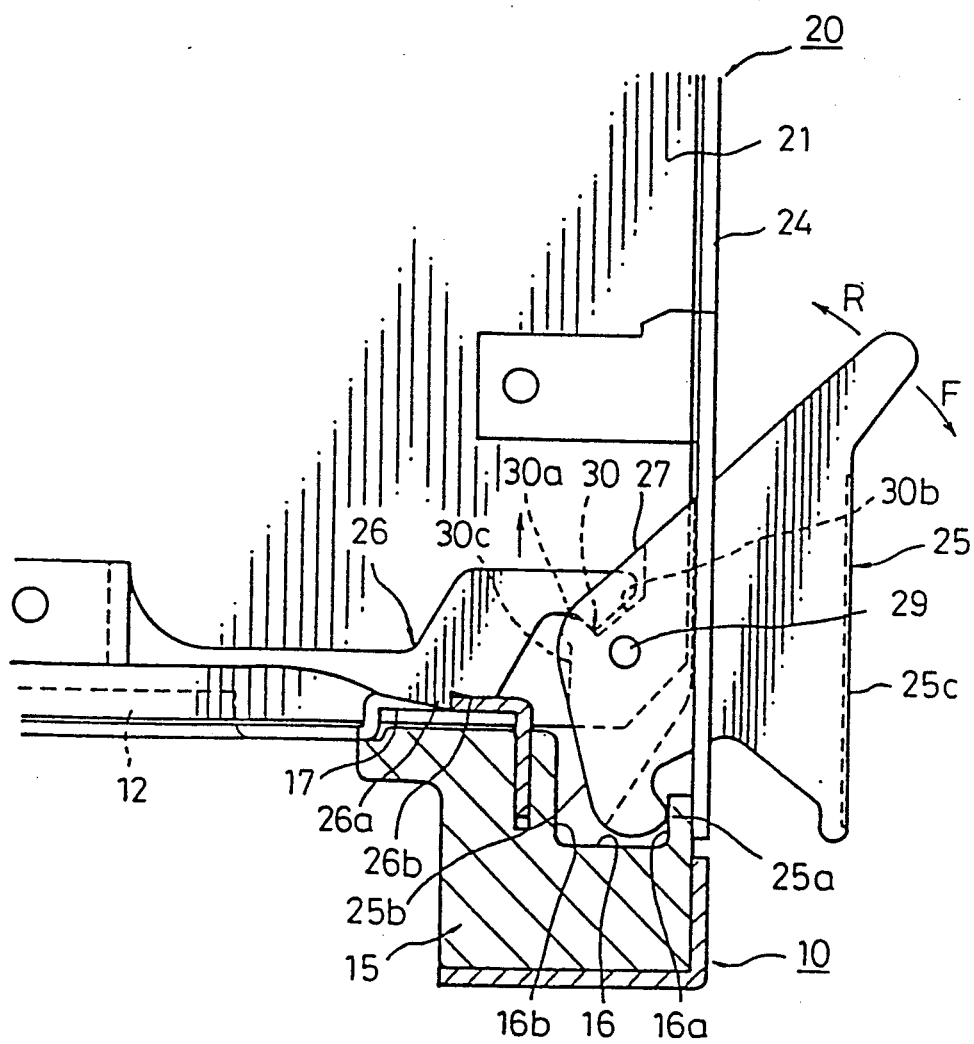
FIG. 5 is a sectional side view of a main portion of the printed board unit according to the first embodiment illustrating a full insertion thereof into the shelf.

As apparent from FIGS. 4 and 5, the lever 25 is provided with a pair of yokes 27 and 28 covering a lower corner of the printed board 21 in such a manner that the lower corner enters a slit formed between the yokes 27 and 28. The yokes 27 and 28 hold opposite ends of a pin 29 penetrating the thickness of the printed board 21, whereby the lever 25 is pivotable relative to the printed board 21 about the pin 29 in the directions shown by arrows R and F in FIG. 5.

Figure 6:
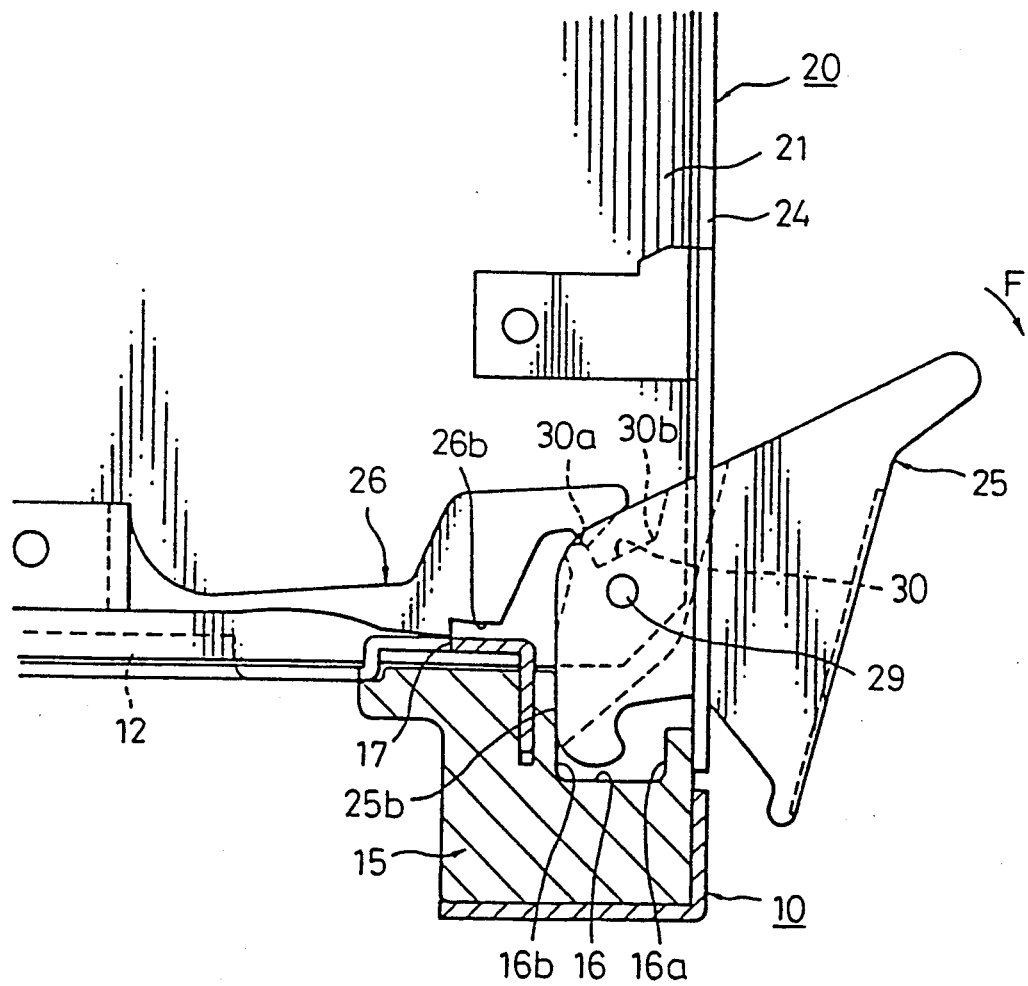
FIG. 6 is a sectional side view of the board as shown in FIG. 5, illustrating an initial stage of the insertion thereof.

A block 15 having a channel 16 extending along a lower transverse edge of the opening of the shelf 10, is mounted inside a front wall of the shelf 10. The lever 25 has a front operating surface 25a for abutting against a front inner wall 16a of the channel 16 and a rear operating surface 25b for abutting against a rear inner wall 16b of the channel 16. If the lever 25 is operated in the direction R from a position shown in FIG. 9, in which the printed board unit 20 is not completely inserted, the front operating surface 25a (FIG. 5) is engaged with the front inner wall 16a and the printed board unit 20 is pushed into the shelf 10 for a distance at least sufficient to engage the male-type connector 22 with the female-type connector 14. Conversely, as shown in FIG. 6, if the lever 25 is operated in the direction F, the rear operating surface 25b is engaged with the rear inner wall 16b and the printed board unit 20 is withdrawn from the shelf 10 for a distance at least sufficient to disengage the male-type connector 22 from the female-type connector 14.

An aperture 17 is formed on a bottom wall of the shelf 10, as a stop means into which a shoulder 26a formed on the lower side of the lock arm 26 is fitted. When the shoulder 26a is fitted in the aperture 17, the printed board unit 20 is locked in the shelf 10, and thus loosening of the printed board unit 20 in the shelf is prevented. The aperture 17 is positioned such that the shoulder 26a is engaged therewith when the printed board unit 20 is pushed into the shelf 10 until the male-type connector 22 is fully inserted in the female-type connector 14.

The lock arm 26 is provided with an operating surface 26b engageable with the bottom wall of the shelf 10.

The lever 25 also has a cam surface 30 for converting a rotation of the lever 25 in the direction R or F to an engagement and disengagement motion of the lock arm 26 relative to the aperture 17 in the shelf unit 10. The cam surface 30 is provided with a top 30a for resiliently forcing the lock arm 26 to disengage from the aperture 17 of the shelf unit 10 when the lever 25 is rotated in the direction F, so that the printed board unit 20 can be withdrawn from the shelf 10. The cam surface 30 is also provided with a cavity 30b adjacent to the top 30a, for releasing the resilient force on the lock arm 26 when the lever 25 is rotated in the direction R, so that the printed board unit 20 is inserted into and fixed in the shelf 10. As apparent from FIG. 5, a part of the lock arm 26 fits into the cavity 30b, and thus free rotation of the lever 25 is restricted when the printed board unit 20 is fully inserted the shelf 10. Accordingly, the lever 25 cannot be rotated in the direction F until the lock arm 26 is resiliently displaced, and therefore, the lever 25 is stably maintained in position and cannot be accidentally moved.

Further, the cam surface 30 of the lever 25 is provided with another cavity 30c adjacent to the top 30a and opposite to the cavity 30b. Accordingly, when the lever 25 is rotated in the direction F to resiliently force the lock arm 26 to be released from the aperture 17, the lock arm 26 is engaged with the cavity 30c by the elasticity thereof, and thus a free rotation of the lever 25 is restricted by a toggle action of the lock arm 26.

Next, the motion of the lever 25 and the lock arm 16 during the insertion and withdrawal of the printed board unit 20 will be described below.

FIG. 5 and 10(a) illustrate the insertion and withdrawal mechanism according to the present invention when the printed board unit 20 has been completely inserted into the shelf 10. In this state, the lock arm 26 is free from the action of the lever 25 and is engaged in the aperture 17 of the shelf 10, and accordingly, the printed board unit 20 cannot be accidentally withdrawn from the shelf 10. In addition, as stated above, since free rotation of the lever 25 is restrained by the lock arm 26 so that an angular phase of the levers 25 on each of the printed board units 20 is identical, the appearance of a front side of the shelf 10 in which the printed board units 20 are inserted is neat. Further, since the front wall surface 25c of the lever 25 is vertical, a label can be conveniently attached to this area to indicate various items such as a production number of a printed board or the like To remove the printed board unit 20 from the shelf unit 10, first the lever 25 is rotated in the direction F, from the position in which the lever 25 is engaged with the front inner wall 16a of the channel 16, as shown in FIGS. 5 and 10(a), to the position in which the lever 25 is engaged with the rear inner wall 16b of the channel 16, as shown in FIGS. 6 and 10(b). Then the front end of the lock arm 26 is pushed upward by the action of the top 30a of the cam surface 30 so that the shoulder 26a of the lock arm 26 is disengaged from the aperture 17 of the shelf 10.

Figure 7:
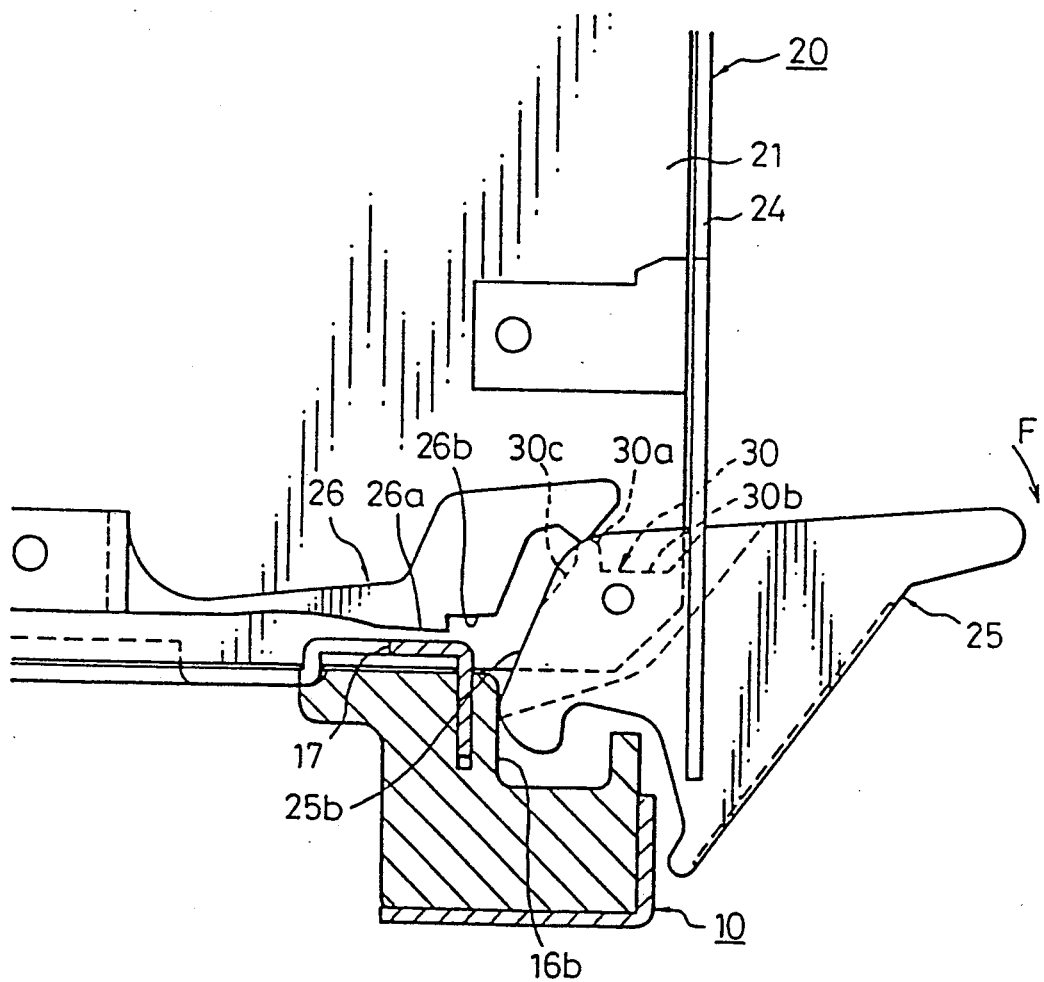
FIGS. 7 and 8 are, respectively sectional side views of the board unit as shown in FIG. 6 illustrating intermediate stages of the withdrawal thereof.
Figure 10D:
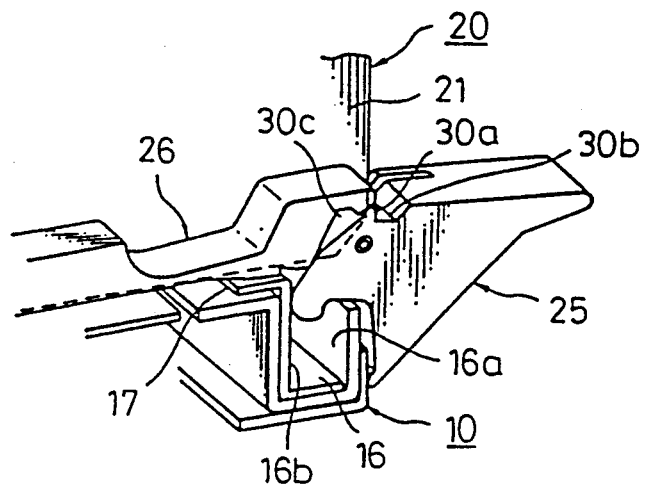

A further rotation of the lever 25 in the direction F causes a withdrawal of the printed board unit 20 from the shelf unit 10, due to the action of the lever 25 when engaged with the rear inner wall 16b of the channel 16 and simultaneously, the male-type connector 22 is easily withdrawn from the female-type connector 14. FIG. 10(c) illustrates a relative position of the lever 25 and the lock arm 26 at a beginning stage of the withdrawal of the printed board unit 20, and FIGS. 7 and 10(d) illustrate the relative position when the male-type connector 22 has been completely withdrawn from the female-type connector 14.

Figure 10E:
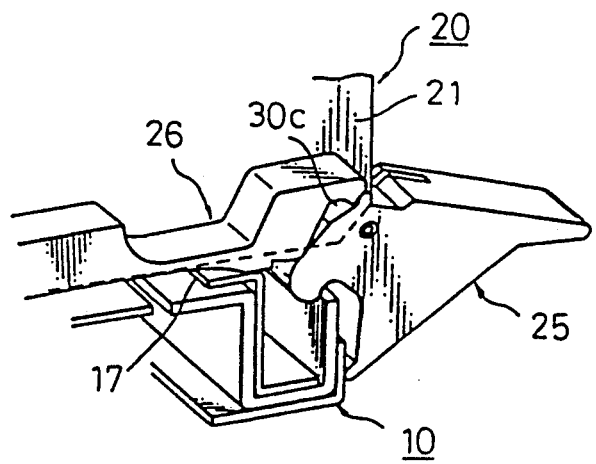

When the lever 25 is further rotated in the direction F, until the front end of the lock arm 26 is engaged with the cavity 30c of the cam surface 30 as shown in FIG. 10(e), a toggle action caused by the elasticity of the lock arm 26 is applied to the lever 25 to hold the lever 25 in this rotational position.

Figure 11A:
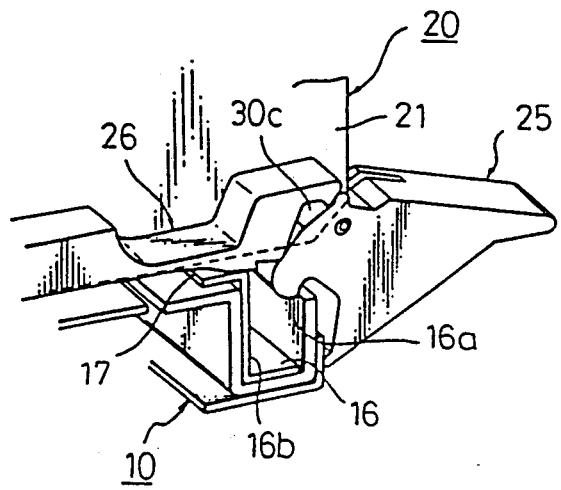
FIGS. 11(a) through (e) are, respectively, perspective views, illustrating a sequential motion of a lever and a lock arm during the insertion of the board unit.

The lever 25 on the printed board unit 20 withdrawn from the shelf 10 occupies a rotational position as shown FIG. 11(a), and thus does not interfere with an insertion of the printed board unit 20 by the operator. Accordingly, the operator can carry out the insertion operation by pushing the printed board unit 20 into the shelf 10 without manually holding the lever 25.

Figure 11B:
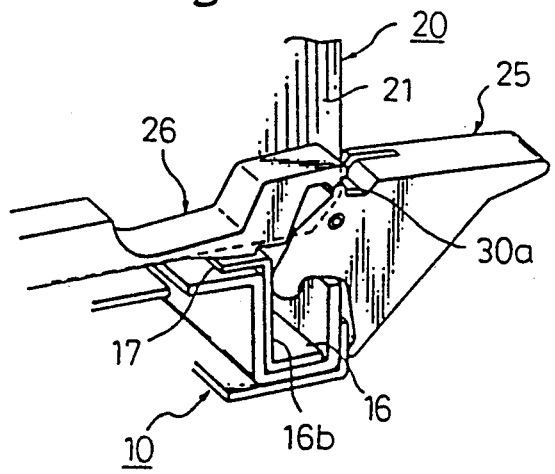
Figure 11C:
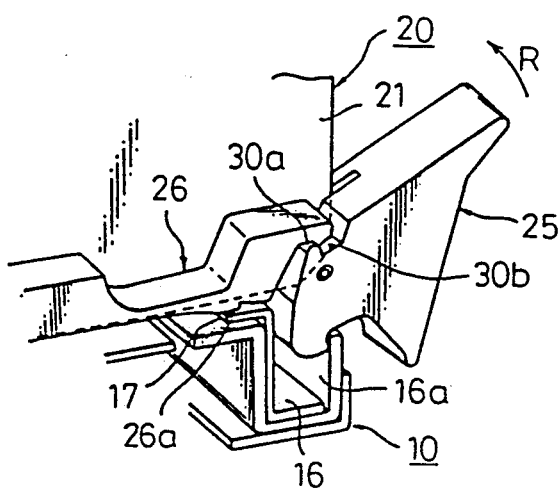
Figure 11D:
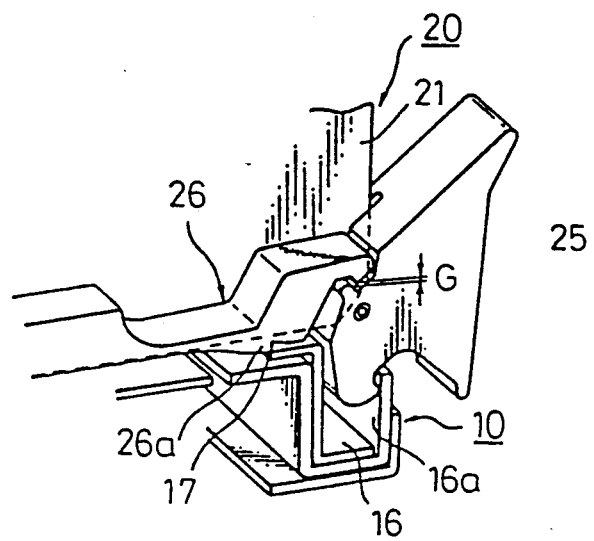

After the printed board unit 20 has been inserted into the shelf 10 until the lock arm 26 is engaged with the rear inner wall 16b of the channel 16, as shown in FIG. 11(b), the lever 25 is rotated in the direction R until the lever 25 is engaged with the front inner wall 16a of the channel 16 in the shelf 10, as shown in FIGS. 11(c) and 11(d). Then the lock arm 26 is moved from the cavity 30c to override the top 30a of the cam surface 30 and fit into the cavity 30b of the cam surface 30, and accordingly, a gap G is formed between the lock arm 26 and the lever 25.

Namely, the lock arm 26 is free from the action of the lever 25 and tends to resume a restraint-free state under its own elasticity but as the printed board unit 20 is not completely inserted in the shelf 10, the lock arm 26 is still held on the lower wall of the shelf 10.

When the lever 25 is further rotated in the direction R while engaging with the front inner wall 16a of the channel 16, the printed board unit 20 is further inserted into the shelf unit 10 so that pins of the male-type connector 22 are frictionally inserted in the female-type connector 14. This engagement between the connectors 14 and 22 can be carried out with less force, due to the lever action of the lever 25.

Figure 11E:
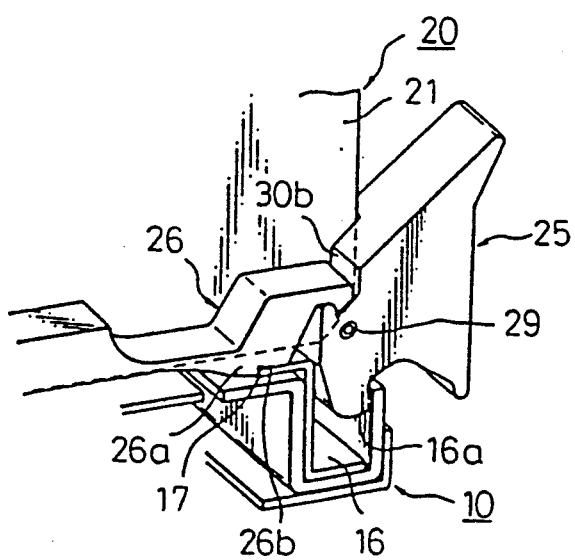

When the printed board unit 20 has been inserted into the shelf 10 until the male-type connector 22 is fully engaged with the female-type connector 14, the shoulder 26a of the lock arm 26 is fitted in the aperture 17, as shown in FIG. 11(e). At this stage the operating surface 26b of the lock arm 26 impinges on the bottom wall of the shelf 10, due to the release of an elastic energy stored in the lock arm 26, and this causes a clicking noise by which the operator can confirm the full insertion of the printed board unit 20.

Figure 12:
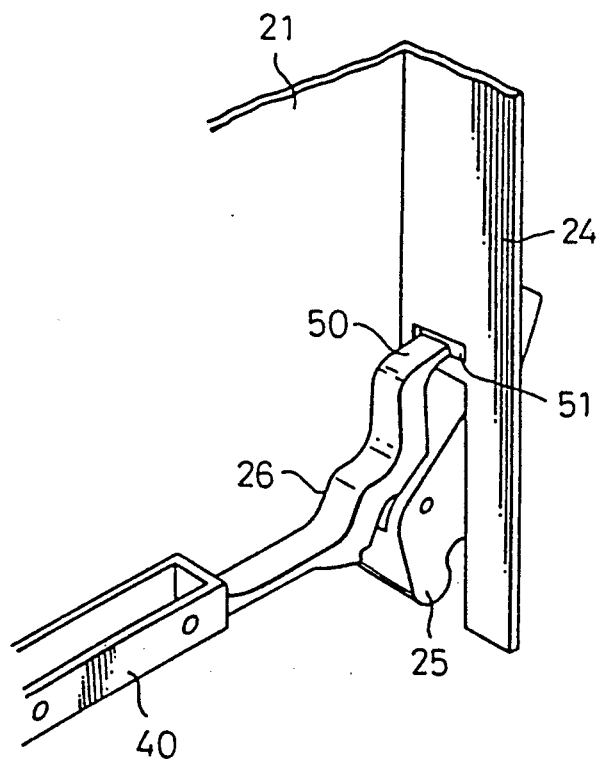
FIG. 12 is a perspective view of a lock arm and a window on a front plate associated with the lock arm according to a second embodiment of the present invention.
Figure 13:
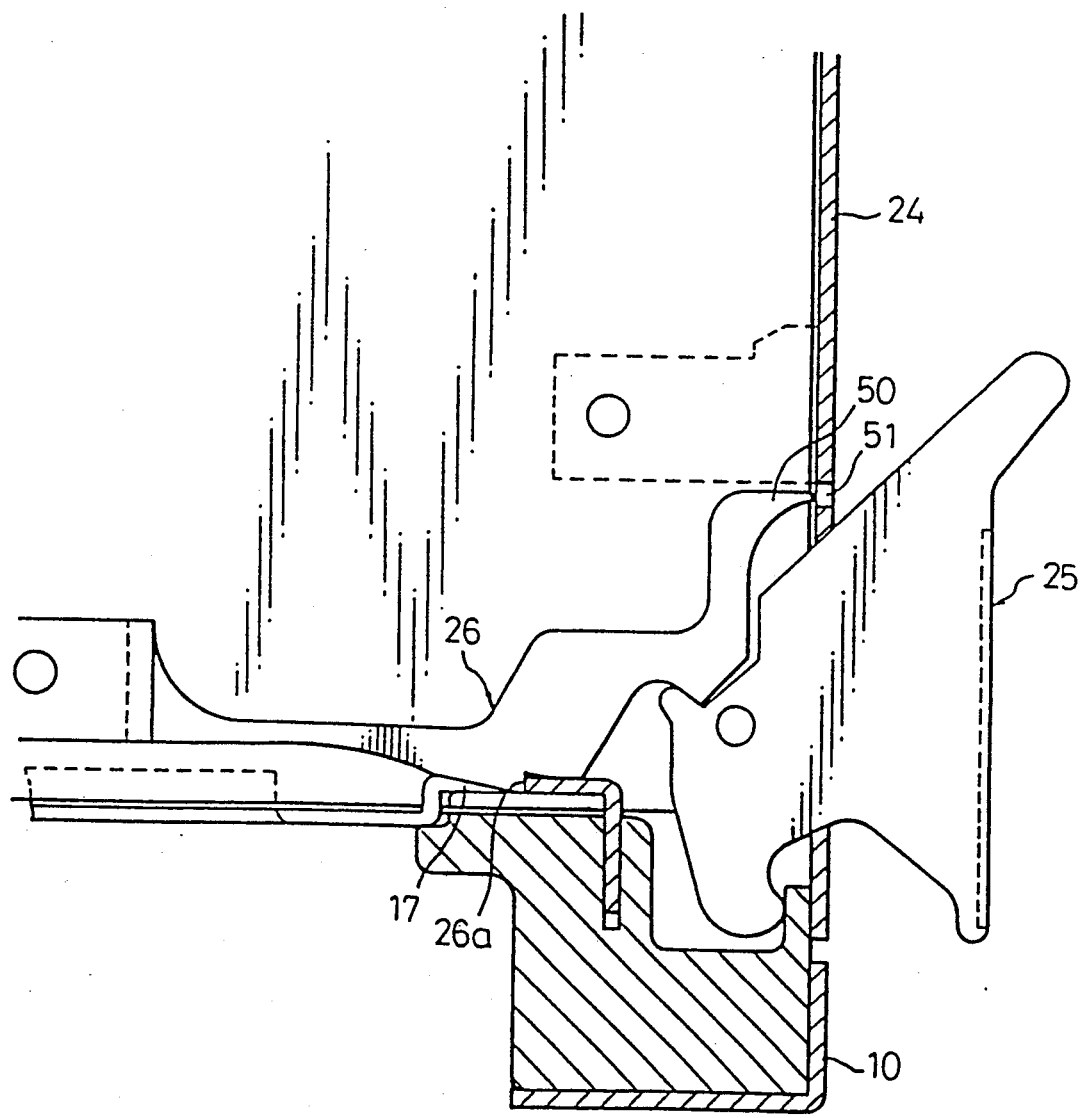
FIG. 13 is a sectional side view of a main portion of the printed board unit according to the second embodiment, illustrating a full insertion thereof into the shelf.
Figure 14:
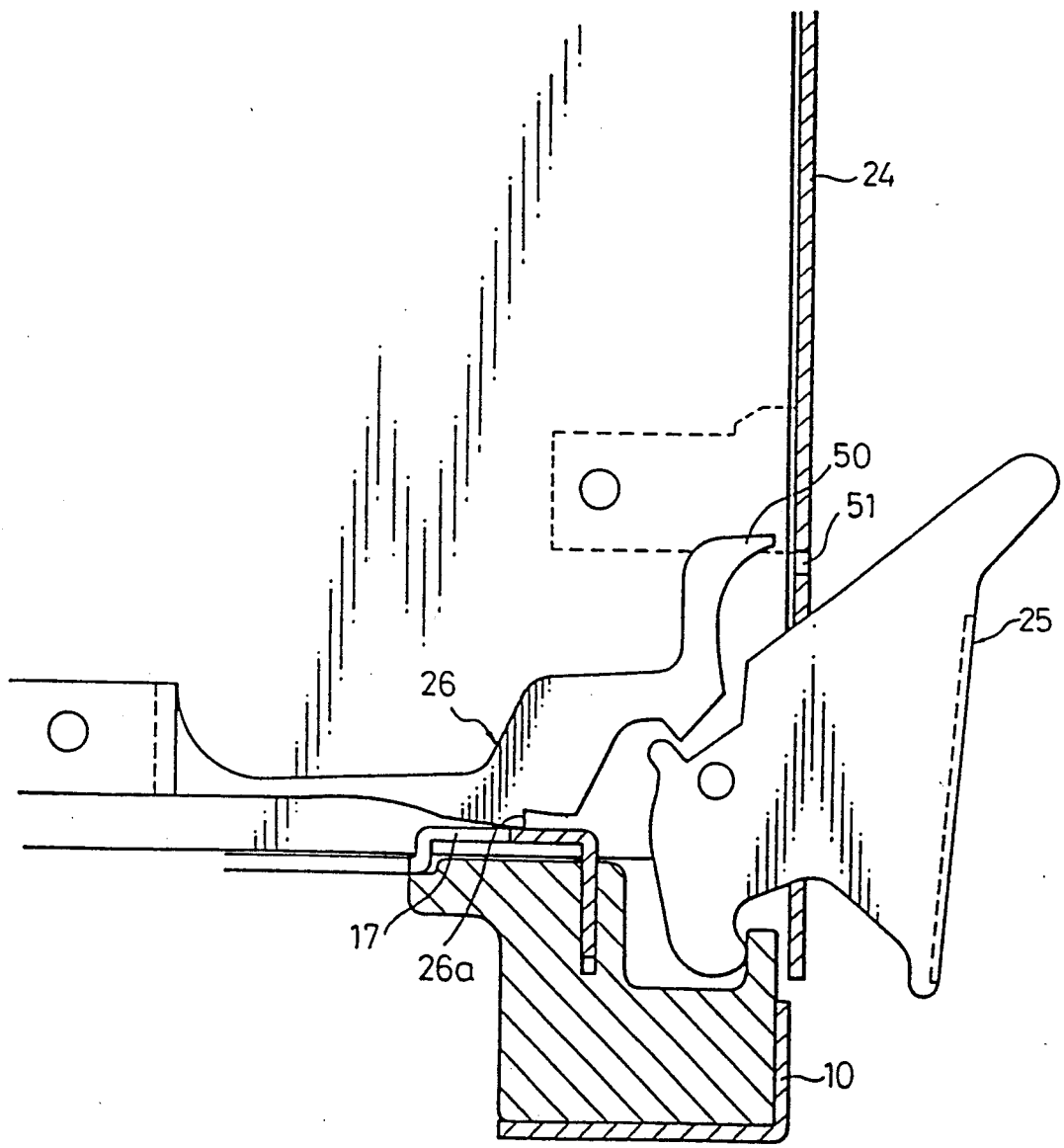
FIG. 14 is a view similar to FIG. 13 and illustrating an improper insertion of the printed board unit.

FIGS. 12 through 14 illustrate a second embodiment of the present invention, which is an improvement of the first embodiment, and by which the operator can visually confirm the full insertion of the printed board unit, in addition to the clicking noise. According to this embodiment, the lock arm 26 is provided with a beak-like projection 50 at the front free end thereof, and a window 51 is formed in the front plate 24 of a printed board 21 so as to confront the projection 50. Since the mechanism according to the second embodiment is substantially the same as that of the first embodiment, except for the above features, a description of the other parts of the mechanism is omitted. Note, in these figures identical reference numerals are used to indicate corresponding parts shown in other figures. The projection 50 and the window 51, respectively, are provided at a position outside of the range of motion of the lock arm 26 and the lever 25, to ensure that they do not interfere with the insertion and removal of the printed board 21. When the printed board unit 20 is incompletely inserted in the shelf 10, the shoulder 26a of the lock arm 26 does not fit into the aperture 17 of the shelf 10 but rests on the bottom wall of the shelf 10, as shown in FIG. 14. This results in an upward resilient bending of the lock arm 26 whereby the projection 50 is not aligned with the window 51. Conversely, if the printed board unit 20 has been fully inserted into the shelf 10, the shoulder 26a of the lock arm 26 fits in the aperture 17 and resiliently resumes its original straight state, so that the projection 50 confronts the window 51 and can be seen from the outside of the shelf 10 through the window 51 as shown in FIG. 13. At the same time, the lock arm 26 impinges against the bottom wall of the shelf 10 and causes a clicking noise, as described in the first embodiment. According to the second embodiment, even though the operator does not hear the clicking noise due to a noisy environment, the full insertion state of the printed board 21 can be visually confirmed.

FIG. 15 through 18 illustrate a third embodiment of the present invention. This embodiment is characterized in that the lock arms 26 mounted at the front end of the upper and lower edges of the printed board 21. are integrally formed with a horizontal reinforcement member 40, to prevent bending of the printed board 21. Reinforcement member 40 preferably is constructed of a plastic material having both elasticity and rigidity, such as polyphenylene-sulfide.

A printed board unit 20 assembled with the above elements will be described below with reference to FIG. 15. As the upper and lower horizontal reinforcement members 40 are symmetrically structured, the description relates to the lower member 40.

Figure 15:
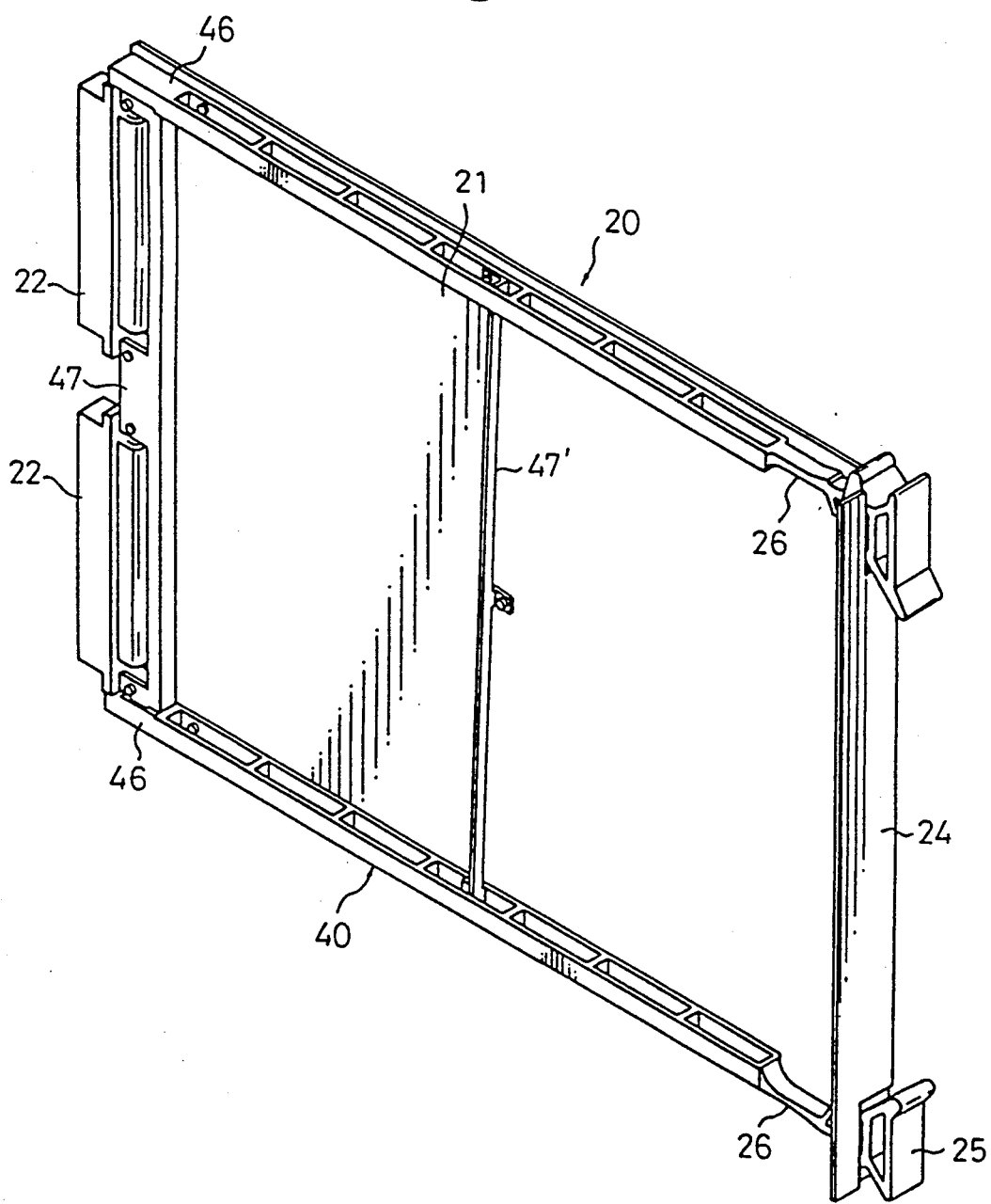
FIG. 15 is a front perspective view of a printed board unit according to a third embodiment of the present invention.
Figure 16:
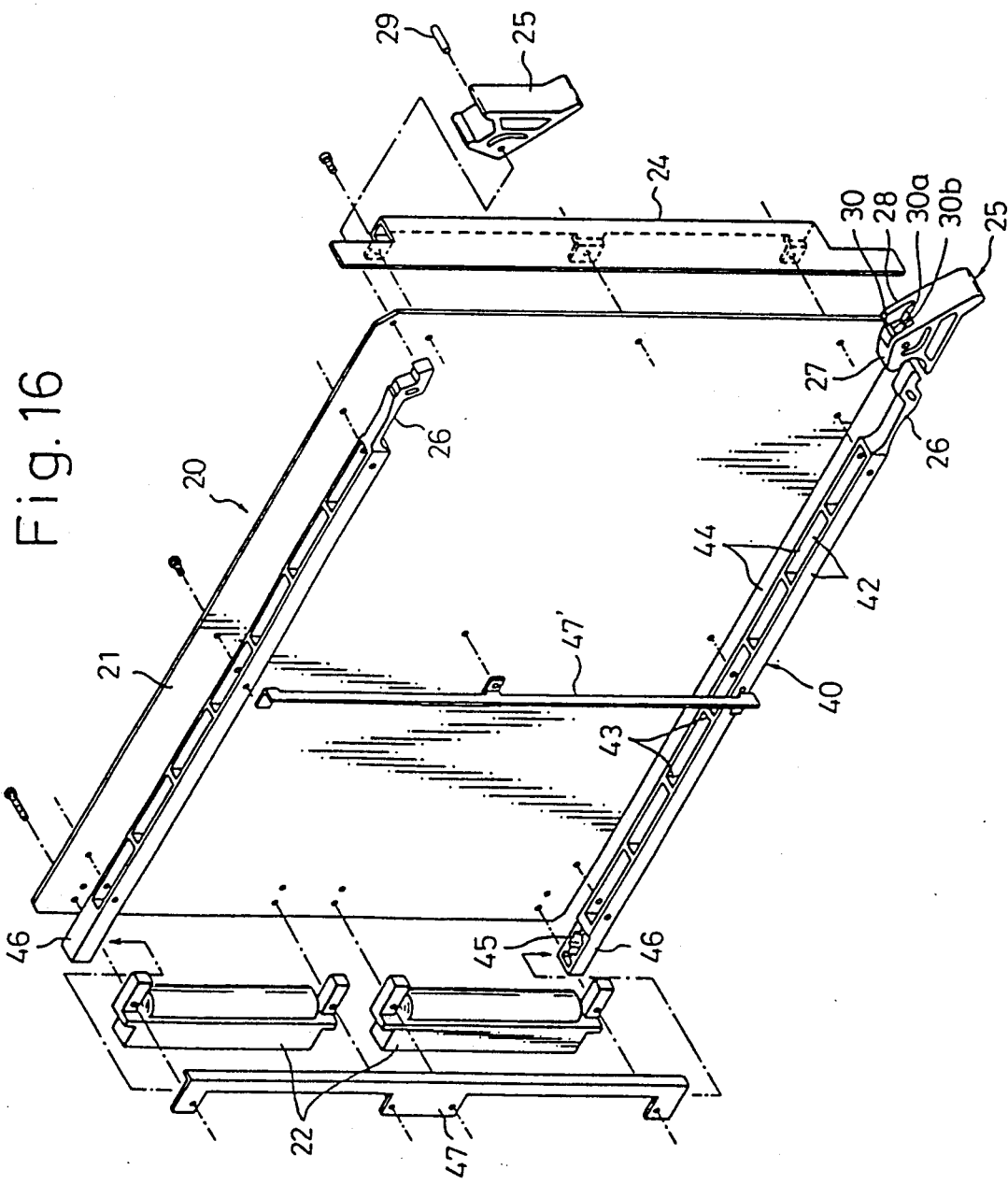
FIG. 16 is an exploded perspective view of the printed board unit according to the third embodiment.

As shown in FIGS. 15 and 16, the reinforcement member 40 has a pair of side walls 42 extending in the lengthwise direction and a plurality of bridges 43 spaced from each other and connecting the side walls 42, to obtain a desired structural rigidity. A vertical through-hole 44 for ventilation is formed over the length of the reinforcement member 40 and sectioned by adjacent bridges 43, 43. The lock arm 26 is integrally molded together with the reinforcement member 40, as stated before. When the reinforcement member 40 is fixed to the printed board 21, for example, by rivetting, the lock arm 26 is also mounted onto the printed board 21, and thus the labour necessary for assembly of the printed board can be greatly reduced. As the vertical through-hole 44 is formed over the length of the reinforcement member 40, even if a space between the adjacent printed boards 21 is sectioned at the upper and lower edges by these reinforcement members 40, 40 when the printed board unit 20 is inserted in the shelf 10, an internal ventilation of the shelf 10 can be carried out through the through-hole 44, whereby heat generated within the shelf 10 due to the operation of various electronics elements is exhausted outside of the shelf by an upward flow of the hot air stream.

According to the third embodiment, to further strengthen the printed board unit 20, vertical reinforcement members 47, 47' are provided at the rear end area and at the middle area of the printed board 21 for connecting the upper and lower horizontal reinforcement members 40, 40 to each other. The one vertical reinforcement member 47' at the middle area is made of a metal plate and is fixed to the printed board 21 together with the middle portion of the horizontal reinforcement member 40 by rivetting at opposite ends thereof.

The other reinforcement member 47 at the rear end area of the printed board 21 (which is the same as the reinforcement member 23 shown in FIGS. 1 through 4) is fixedly secured to the horizontal reinforcement members 40, 40 without rivetting or screwing according to the present invention, as described below with reference to FIG. 16.

Figure 17:
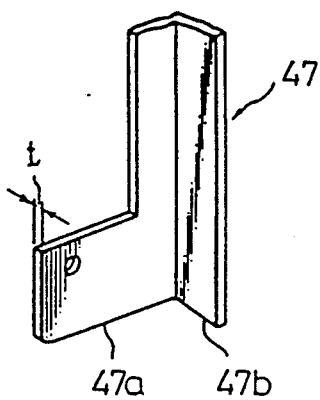
FIG. 17 is a perspective view of a lower end portion of a vertical reinforcement member on an enlarged scale according to the third embodiment.
Figure 18:
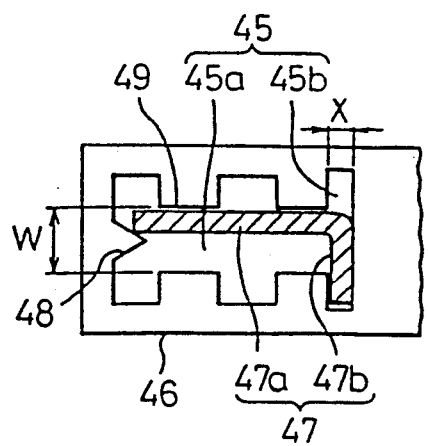
FIG. 18 is enlarged top a groove for engagement formed on a connection portion of a horizontal reinforcement member.

As shown in FIG. 16, this horizontal reinforcement member 40 is provided with a coupler 46 at the rear end region thereof, having a coupling groove 45 on the upper side. The coupling groove 45 has a shape and dimensions such that the lower end of the vertical reinforcement member 47 can be press-fitted therein. That is, as shown in FIG. 17, the end portion of the vertical reinforcement member 47 has a L-shaped cross-section comprising a longer edge 47a and a shorter edge 47b. When coupled to the horizontal reinforcement member 40, the longer edge 47a is positioned in parallel to the length of the member 40. The groove 45 of the coupler 46 has a shape as shown in FIG. 18, wherein a lengthwise groove 45a receives the longer edge 47a of the vertical reinforcement member 47 and has a width w wider than a thickness t of a web of the vertical reinforcement member 47. A triangular bulge 48 protrudes inwardly from a midportion of the rear inner wall of the groove 45a, which is connected to a midportion of a transverse groove 45b at the end opposite to the bulge 48. This groove 45b receives the shorter edge 47b of the reinforcement member 47 and has a width x substantially equal to the thickness t of a web.

The engagement of the reinforcement member 47 with the coupling groove 45 will be explained below with reference to FIG. 18. When the longer edge 47a of the reinforcement member 47 is inserted in the groove 45a while one-side faces the side wall 49, one side of the longer edge 47a is brought into contact with this side wall 49 at at least two portions thereof and a tip end of the longer edge 47a is brought into contact with one of two oblique sides of the triangular bulge 48. On the other hand, the shorter edge 47b is fitted into one half the area of the groove 45b while a tip end of the shorter edge 47b is in contact with the inner wall of the groove 45b. As a result, movement of the reinforcement member 47 is limited in the direction along the groove 45a by the groove 45b, and in the direction transverse to the groove 45a by the bulge 48 and the side wall 49 of the groove 45a, so that the position thereof is stably maintained.

A similar engagement is made between the upper horizontal reinforcement member 40 and the upper end of the vertical reinforcement member 47, and thus the pair of upper and lower horizontal reinforcement members 40, 40 can be coupled through the vertical reinforcement member 47.

As the coupling groove 45 has a symmetrical shape with respect to the lengthwise axis thereof, as apparent from the plan view shown in FIG. 18, the pair of horizontal reinforcement members 47 are interchangeable, whereby the number of parts necessary for assembly of the printed board can be reduced.

As stated hereinbefore, according to the present invention, a lever is mounted on the upper and lower corners of the leading edge of a printed board, for displacing the printed board unit relative to a shelf by the action of the lever. A resiliently deformable lock arm is also mounted on the printed board in association with the lever, and the arm is resiliently engageable with a stop means formed on the shelf when the printed board unit is completely inserted into the shelf, to prevent loosening of the printed board unit in the shelf. In the area of the lever associated with the lock arm, the lever has a cam surface for converting the rotation of the lever to a linear displacement of the printed board unit relative to the shelf by an elastic deformation of the lock arm when inserting or withdrawing the printed board unit to and from the shelf. Therefore, the printed board unit can be locked or unlocked relative to the shelf by a simple rotation of the lever before a subsequent insertion or withdrawal of the printed board unit caused by the rotation of lever. When locked, the lock arm is resiliently impinged on the shelf wall and generates a clicking noise, by which the operator can be made aware of a full insertion of the printed board unit. According to another aspect of the present invention, a beak-like projection provided at a tip end of the lock arm is aligned with a window formed on a front plate of the printed board upon a full insertion of the board, and thus the operator can visually confirm the insertion.

According to a further aspect of the present invention, the lock arm is integrally formed with a horizontal reinforcement member of the printed board, so that the labour cost for assembly of the printed board unit can be greatly reduced.

The horizontal reinforcement member may have a coupling groove whereby upper and lower horizontal reinforcement members are connected together by press-fitting a vertical reinforcement member thereto without rivetting or screwing.

Figure 8:
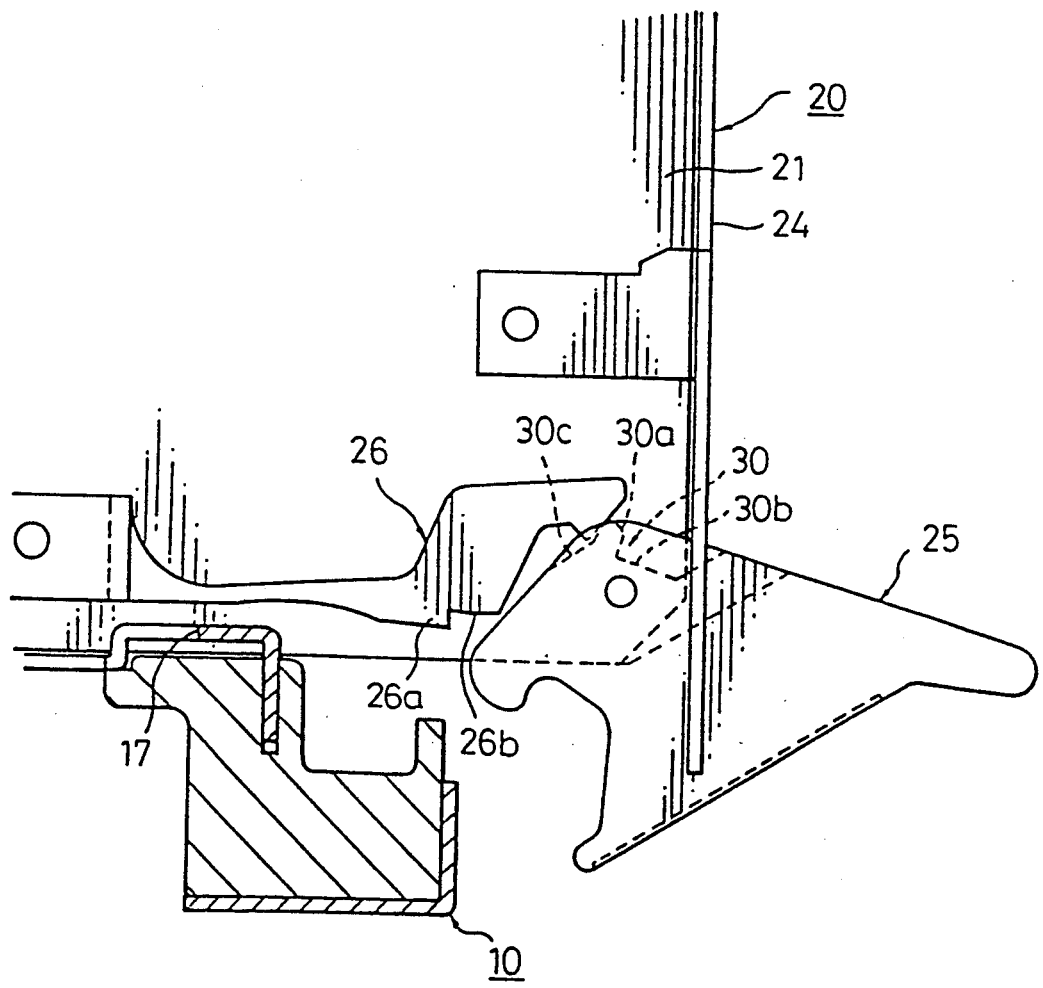
Figure 9:
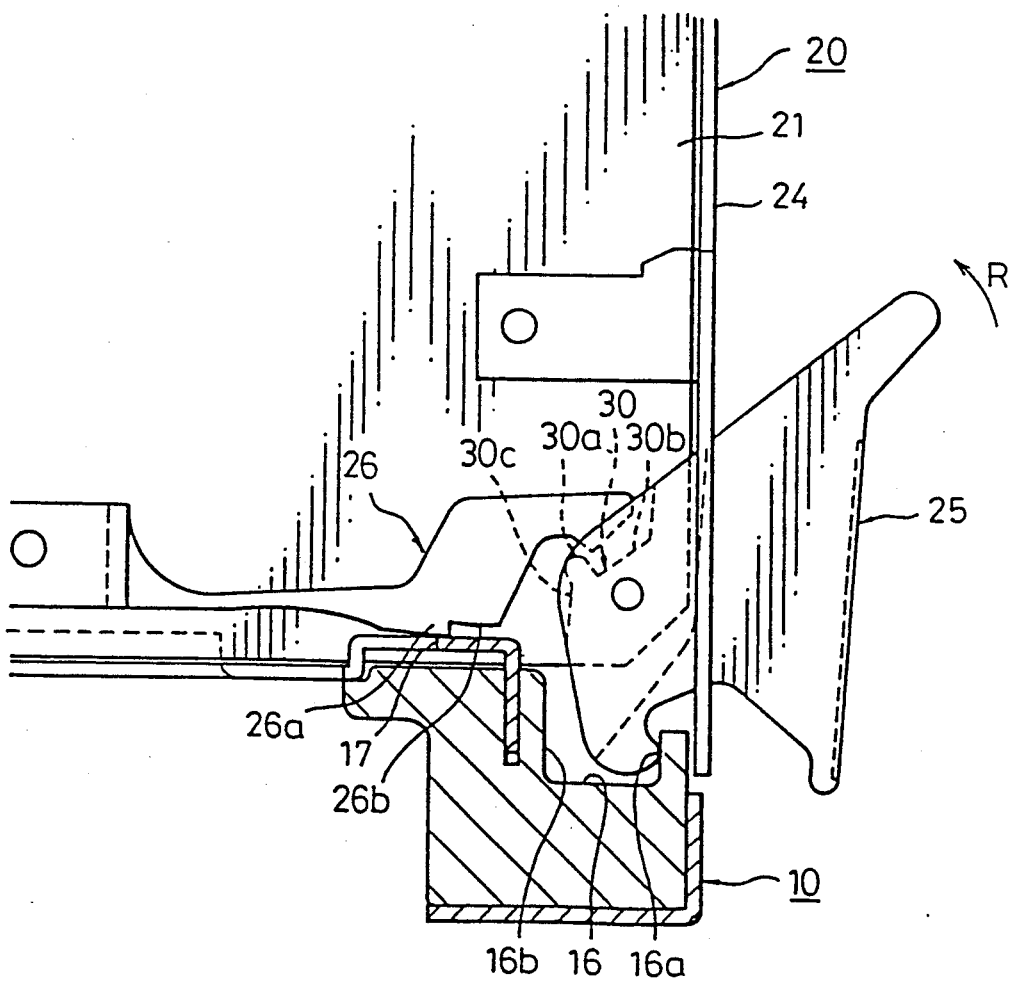
FIG. 9 is a sectional side view of the board unit as shown in FIG. 6, illustrating a final stage of an insertion thereof.

In addition, according to the present invention, as shown in FIG. 5, the lever is locked by the locking arm so that a front side of the lever is kept in an upright position and exhibits an neat appearance when viewed from outside of the shelf. On the other hand, when the printed board unit is withdrawn from the shelf, the lever is also locked by the lock arm so that the front side thereof is kept in a down position as shown in FIG. 8, which enables the operator to easily carry out the insertion of the printed board without manually holding the lever in a horizontal position.

We claim:

1. In an electronics circuit device in which a plurality of printed board units (20) are accommodated in parallel to each other within a box-like shelf (10), each printed board unit (20) mounting various electronic circuit elements and being provided with a connector (22) at a trailing edge thereof, said connector (22) on each printed board unit (20) being insertably connectable with a corresponding connector (14) mounted on the back board (13) within the shelf (10), a mechanism for inserting and withdrawing a printed board unit (20) to and from said shelf (10), said mechanism comprising a lever means (25) pivotably secured at an upper and/or lower corner of the front edge of the printed board unit (20) to be rotatable in opposite directions and acting, with front and rear operating surfaces (25a, 25b), respectively, of the lever means (25), on front and rear inner walls (16a, 16b) of a channel (16) provided on the shelf (10) along a front edge thereof, to displace the printed board unit (20) relative to the shelf (10) for at least a distance necessary for engaging or disengaging the connector (22) on the printed board unit (20) to and from the connector (14) on the back board (13), and a lock arm (26) secured on the printed board unit (20) and resiliently deformable and engageable with a stop means (17) formed on the shelf (10) for preventing loosening of the printed board unit (20) in the shelf (10) after the printed board unit (20) has been fully inserted into the shelf (10) so that the connector (22) on the printed board unit (20) is insertably engaged with the connector (14) on the back board (13), said lever means (25) having a cam surface (30) in a region confronting the lock arm (26), for converting a rotational motion of the lever means (25) to an engagement/disengagement motion of the lock arm (26) relative to the stop means (17) on the shelf (10).

2. A mechanism for inserting and withdrawing a printed board unit as defined by claim 1, which further comprises a projection (50) provided at a free end of said lock arm (26), said projection (50) being adapted to be aligned with a window (51) formed on a front plate (24) fixed on a leading edge of the printed board unit (20) so as to be observable form outside when engagement between the lock arm (26) and the stop means (17) is completed.

3. A mechanism for inserting and withdrawing a printed board unit as defined by claim 1, wherein said lock arm (26) is integrally formed with a reinforcement member (40) to be secured horizontally to an upper or lower edge of the printed board unit (20).

4. A mechanism for inserting and withdrawing a printed board unit as defined by claim 1, wherein said lever means (25) is maintained in respective predetermined positions by a resilient engagement of said lever means (25) with said lock arm (26) when said printed board unit (20) is fully inserted and withdrawn to and from the shelf (10).

5. A mechanism for inserting and withdrawing a printed board unit as defined by claim 1 wherein said lever means (25) includes a lever means (25) adjacent each of an upper and a lower corner of the leading edge of said printed board unit (20) and wherein a lock arm (26) is associated with each lever means (25).

6. In an electronics circuit device in which a plurality of printed board units (20) are accommodated in parallel to each other within a box-like shelf (10), each printed board unit (20) mounting various electronic circuit elements and being provided with a connector (22) at a trailing edge thereof, said connector (22) on each printing board unit (20) being insertably connectable with a corresponding connector (14) mounted on the back board (13) within the shelf (10), a mechanism for inserting and withdrawing a printed board unit (20) to and from said shelf (10), said mechanism comprising a lever means (25) pivotably secured on the printed board unit (20) and acting on the printed board unit (20) to displace the printed board unit (20) relative to the shelf (10) for at least a distance necessary for engaging or disengaging the connector (22) on the printed board unit (20) to and from the connector (14) on the back board (13), and a lock arm (26) secured on the printed board unit (20) and resiliently deformable and engageable with a stop means (17) formed on the shelf (10) for preventing loosening of the printed board unit (20) in the shelf (10) after the printed board unit (20) has been fully inserted into the shelf (10) so that the connector (22) on the printed board unit (20) is insertably engaged with the connector (14) on the back board (13), said lock arm (26) being integrally formed with a reinforcement member (40) to be secured horizontally to an upper or lower edge of the printed board unit (20), said horizontal reinforcement member (40) being provided with a vertical throughhole (44), and said lever means (25) having a cam surface (30) in a region confronting the lock arm (26), for converting a rotational motion of the lever means (25) to an engagement/disengagement motion of the lock arm (26) relative to the stop means (17) on the shelf (10).

7. In an electronics circuit device in which a plurality of printed board units (20) are accommodated in parallel to each other within a box-like shelf (10), each printed board unit (20) mounting various electronic circuit elements and being provided with a connector (22) at a trailing edge thereof, said connector (22) on each printed board unit (20) being insertably connectable with a corresponding connector (14) mounted on the back board (13) within the shelf (10), a mechanism for inserting and withdrawing a printed board unit (20) to and from said shelf (10), said mechanism comprising a lever means (25) privotably secured on the printed board unit (20) at each of upper and lower corners of the leading edge thereof and acting on the printed board unit (20) to displace the printed board unit (20) relative to the shelf (10) for at lest a distance necessary for engaging or disengaging the connector (22) on the printed board unit (20) to and from the connector (14) on the back board (13), and a pair of lock arms (26) secured on the printed board unit (20) and resiliently deformable and engageable with stop means (17) formed on the shelf (10) for preventing loosening of the printed board unit (20) in the shelf (10) after the printed board unit (20) has been fully inserted into the shelf (10) so that the connector (22) on the printed board unit (20) is insertably engaged with the connector (14) on of the back board (13), one of said lock arms (26) being integrally formed with a reinforcement member (40) secured horizontally to an upper edge of the printed board unit (20) and the other of said locked arms (26) being integrally formed with a reinforcement member (40) secured to a lower edge of the printed circuit board unit, each said horizontal reinforcing member (40) being provided with a groove (45) for a press-fit engagement with each of opposite ends of a vertical reinforcement member (47) whereby said upper and lower horizontal reinforcement members (40) are fixedly connected to each other, and each of said lever means (25) having a cam surface (30) in a region confronting one of the arms (26), for converting a rotational motion of the lever means (25) to an engagement/disengagement motion of the lock arm (26) relative to the stop means (17) on the shelf (10).

8. A mechanism for inserting and withdrawing a printed board unit as defined by claim 7, wherein said groove (45) has a symmetrical shape in a plan view relative to a longitudinal axis thereof so that said upper and lower horizontal reinforcement members (40) are interchangeable.

* * * * *

UNITED STATES PATENT AND TRADEMARK OFFICE
CERTIFICATE OF CORRECTION

PATENT NO. : 5,140,501

DATED : August 18, 1992

INVENTOR(S) : TSUTOMU TAKAHASHI, HIDEKI ZENITANI and ITSUO OKAMOTO

It is certified that error appears in the above-identified patent and that said Letters Patent is hereby corrected as shown below:

Title Page [57] Abstract, line 4, "an" should be --and--.

Column 1, line 32, "shelf; so" should be --shelf. To--;

line 33, delete "for";

line 41, "deformed; thus" should be --deformed. Thus--.

Column 2, line 68, "horizontallt" should be --horizontally--.

Column 3, line 33, delete "on".

Column 4, line 6, after "is" insert --an--, line 6, after "top" insert --plan view of--.

Column 6, line 28, after "like" insert a period --.--.

UNITED STATES PATENT AND TRADEMARK OFFICE
CERTIFICATE OF CORRECTION

PATENT NO. : 5,140,501
DATED : August 18, 1992
INVENTOR(S) : TSUTOMU TAKAHASHI, HIDEKI ZENITANI and ITSUO OKAMOTO It is certified that error appears in the above-indentified patent and that said Letters Patent is hereby corrected as shown below:

Column 10, line 14, "an" should be --a--;
line 64, "form" should be --from--.

Signed and Sealed this

Twenty-eighth Day of September, 1993

Attest:

BRUCE LEHMAN

*Attesting Officer*  *Commissioner of Patents and Trademarks*